(12) United States Patent
Schultheiss et al.

(10) Patent No.: US 12,019,176 B2
(45) Date of Patent: Jun. 25, 2024

(54) RADAR SENSOR WITH A COMMUNICATION INTERFACE

(71) Applicant: VEGA GRIESHABER KG, Wolfach (DE)

(72) Inventors: Daniel Schultheiss, Hornberg (DE); Christian Weinzierle, Wolfach (DE); Roland Welle, Hausach (DE); Levin Dieterle, Oberwolfach (DE)

(73) Assignee: VEGA Grieshaber KG, Wolfach (DE)

( * ) Notice: Subject to any disclaimer, the term of this patent is extended or adjusted under 35 U.S.C. 154(b) by 332 days.

(21) Appl. No.: 16/774,714

(22) Filed: Jan. 28, 2020

(65) Prior Publication Data
US 2020/0264265 A1 Aug. 20, 2020

(30) Foreign Application Priority Data
Feb. 18, 2019 (EP) .................................. 19157721

(51) Int. Cl.
| | |
|---|---|
| *G01S 7/00* | (2006.01) |
| *G01S 7/03* | (2006.01) |
| *G06Q 10/08* | (2024.01) |
| *G06Q 10/10* | (2023.01) |
| *G06Q 50/06* | (2024.01) |
| *G06F 1/32* | (2019.01) |

(52) U.S. Cl.
CPC ............ *G01S 7/003* (2013.01); *G01S 7/03* (2013.01); *G06Q 10/08* (2013.01); *G06Q 10/10* (2013.01); *G06Q 50/06* (2013.01); *G06F 1/32* (2013.01)

(58) Field of Classification Search
CPC ............ G01S 7/003; G01S 7/03; G01S 13/88; G06Q 10/10; G06Q 50/06; G06Q 50/28; G06F 1/32; G11C 5/148; G01F 23/284
See application file for complete search history.

(56) References Cited

U.S. PATENT DOCUMENTS 10,469,284 B2 * 11/2019 Feinaeugle ........... G06F 13/122
2009/0288482 A1 11/2009 Faist
(Continued)

FOREIGN PATENT DOCUMENTS

| CN | 109099990 A | 6/2018 |
|---|---|---|
| WO | WO2018158441 A1 | 3/2018 |

OTHER PUBLICATIONS

"Programmable controllers—Part 9: Single-drop digital communication interface for small sensors and actuators (SDCI)", IEC Webstore International Electrotechnical Commission, IEC 61131-9:2013, https://webstore.iec.ch/publication/4558 (Year: 2013).*
(Continued)

*Primary Examiner* — Vladimir Magloire
*Assistant Examiner* — Yonghong Li
(74) *Attorney, Agent, or Firm* — William Gray Mitchell

(57) ABSTRACT

Radar measuring device for factory automation and/or logistics automation with a supply unit for supplying downstream units with energy, a communication unit for receiving data from a superordinate unit and for transmitting data of the measuring device to the superordinate unit, an evaluation and control unit for the control of a downstream high-frequency unit and for the evaluation of measurement data determined by the high-frequency unit, whereby the communication unit is designed as a single-drop interface.

12 Claims, 3 Drawing Sheets

(56) References Cited

U.S. PATENT DOCUMENTS

2010/0103024 A1* 4/2010 Schultheiss ........... G01F 23/284
342/124
2017/0170659 A1* 6/2017 Kech ................... G01F 23/0061
2018/0348038 A1 12/2018 Kleman

OTHER PUBLICATIONS

EPO search report for related European application 19157721.2 issued on Sep. 17, 2019.
Ifm Electronic: Operating instructions Electronic level sensor Contents; XP055598562; Jul. 31, 2015.
Technologie und Anwendung: IO-Link Systembeschriebung; XP55598678; Dec. 31, 2018.
CPO office action for related Chinese application 202010082356, issued on Jun. 13, 2022.

* cited by examiner

RADAR SENSOR WITH A COMMUNICATION INTERFACE

CROSS REFERENCE TO RELATED APPLICATIONS

This patent application claims priority to European Patent Application 19157721.2, filed on Feb. 18, 2019.

STATEMENT REGARDING FEDERALLY SPONSORED RESEARCH OR DEVELOPMENT

No federal government funds were used in researching or developing this invention.

NAMES OF PARTIES TO A JOINT RESEARCH AGREEMENT

Not applicable.

SEQUENCE LISTING INCLUDED AND INCORPORATED BY REFERENCE HEREIN

Not applicable.

BACKGROUND

Field of the Invention

The invention is a radar sensor with a communication interface.

Background of the Invention

As known from the prior art, radar sensors are generally known and, for example, frequently used in the area of process automation. Fill gauges based on radar have found widespread use in recent years in the field of process automation due to numerous advantages of radar measurement technology.

The term automation technology refers to a section of technology, which includes all measures for the operation of machines and systems without human interaction, thus the section of process automation can be understood as the lowest degree of automation. The goal of process automation is to automate the interaction between individual components of a production facility in the areas of chemistry, petroleum, paper, cement, maritime navigation, or mining. A variety of sensors are known for this, which are adapted in particular to the specific requirements of the processing industry, such as mechanical stability, insensitivity to contamination, extreme temperatures, and extreme pressures. Measured values of these sensors are usually transmitted to a control room, in which process parameters such as fill level, flow rate, pressure, or density are monitored and settings for the entire production system can be changed manually or automatically.

FIG. 1 shows an example of such an arrangement 101.

FIG. 1 shows two process measuring devices 102, 103 as examples, which detect the fill level of two containers 104, 105 using radar beams. The measured values are transmitted to the control room 108 using special communication connections 106, 107. For the transmission of the measured values via communication connections 106, 107, both wired and wireless communication standards are used, which were optimized for the specific requirements of process measuring technology. Typical requirements for such communication connections are, for example, forms of signal transmission that are robust to withstand faults, transmission over large distances, low data rates, and frequently low energy density due to the requirements of protection from explosion.

For this reason, the process measuring devices 102, 103 include at least one communication unit for supporting communication standards that meet the requirements of the processing industry. Examples of such communication standards are purely analog standards such as the 4 to 20 mA interface or also digital standards such as HART, Wireless HART, or PROFIBUS.

In control room 108, the incoming data are processed by a process control system 110 and displayed visually on a monitoring system 109. The process control system 110, but also a user 111, can based on the data make changes to setting that can optimize the operation of the entire system 101. In a simple case, a delivery order is triggered at an external supplier for example if a container 104, 105 is at risk of running empty. As the costs for the process sensors 102, 103 in the area of the processing industry compared to the entire arrangement 101 are of minor importance, higher costs can be accepted here for an optimal implementation of the requirements, such as temperature resistance or mechanical robustness. Process sensors 102, 103 therefore have price-intensive components such as radar antennas 112 made of stainless steel. The usual price of such a process sensor 102, 103 is normally in the range of several thousand euros. The radar-based process sensors 102, 103 used in the process industry and known from prior art use radar signals in the range of 6 GHz, 24 GHz, or also 80 GHz, whereby the radar signals according to the FMCW procedure are frequency-modulated in the range of the frequencies specified above.

Another field of automation technology concerns logistics automation. With the help of distance and angle sensors, workflows are automated within a building or within a single logistics system in the area of logistics automation. Typical applications are systems for logistics automation in the area of baggage and cargo processing at airports, in the traffic surveillance field (toll systems), in retail, package distribution, or in the area of building security (access control). The examples listed above have in common that a detection of presence is required in combination with an exact measurement of the size and position of an object based on the respective application. Radar systems of prior art have not yet been able to meet these requirements, which is the reason why different sensors are currently applied on the basis of optical measurement methods using laser, LED, 2D cameras or 3D cameras, which measure distances according to the time of flight (ToF) principle.

FIG. 2 shows an example of a system of logistics automation.

Packets 202, 203 should be sorted by means of a sorting crane 204 within a packet sorting system 201. The packages in this case travel on a conveyor belt 205 into the sorting system. With the aid of one or more laser sensors 206 and/or camera sensors 206, both the position and the size of the package 203 is calculated without touch and transmitted over high-speed data lines 207 to a controller 208, for example a PLC, which is usually part of system 201. Since the transmission of the measured values via lines 207 is time-critical, but the distances to be traveled are rather in the range of just a few meters, high-speed digital protocols such as Profinet, Ethercat, or IO link are frequently used as transmission standards on the communication channels 207, which in contrast to the known protocols of process automation operate in real time-mode, i.e. have a guaranteed transmission of data in a predetermined time. This real-time capability of data transmission, which can be achieved both with wired and wireless communication standards, is the basis for controlling the sorting crane 204 via a control line 209. In contrast to known radar measuring devices, optical sensors 206 allow an exact determination of the size and position of an object 203, since the construction of miniaturized sensors with an extremely small beam opening angle in the area of the optics is technically no problem. In addition, such systems can also be produced very reasonably in comparison with process measuring devices.

A third area of automation technology concerns factory automation. Applications can be found in most various fields, such as automobile manufacturing, food manufacturing, pharmaceutical industry, or generally in the packaging area. The goal of factory automation is to automate the production of goods by machines, production lines, and/or robots, i.e. to allow operation without human interaction. The sensors used here and the specific requirements with regard to the measurement accuracy when recording the position and size of an object are comparable with those in the example of logistics automation stated above. Usually, sensors based on optical measurement methods are also widely used in the area of factory automation.

Optical sensors have dominated so far both in the area of logistics automation as well as in the area of factory automation and safety technology. They are fast, affordable and can reliably determine the position and/or distance from an object due to the relatively easy ability to focus optical radiation underlying the measurement. However, a significant disadvantage of optical sensors is their increased maintenance requirement, as in the previously listed areas, after several thousand operating hours, when soiling of the sensors can be observed, which severely impairs the measurement. In addition, the measurement can be impaired by oil vapors or other aerosols with fog formation especially when used in production lines and then lead to an additional contamination of optical sensors.

It is the objective of the present invention to provide a radar measuring device that overcomes the disadvantages of the optical system, shows high radar resolution and a very good beam focus in connection with a real-time communication interface in a miniaturized design and can be provided at a moderate price.

This objective is attained by a radar measuring device with the features of claim 1, a method with the features of claim 8, and the use of a radar measuring device according to claim 11. Advantageous further developments are the objective of the dependent claims.

BRIEF SUMMARY OF THE INVENTION

In a preferred embodiment, a radar measuring device (301, 401) for factory automation and/or logistics automation with
a supply unit (303, 403) for supplying downstream units with energy,
a communication unit (304, 402) for receiving data from a superordinate unit and for the transfer of data from the radar measuring device (301, 401) to the superordinate unit,
an evaluation and control unit (305, 404) for controlling a downstream high-frequency unit (306, 405) and for evaluating measurement data determined by the high-frequency unit (306, 405), characterized in that the communication unit (304, 402) is configured as a single-drop interface.

In another preferred embodiment, the radar measuring device (301, 401) as described herein, characterized in that the single-drop interface is configured as an IO link interface.

In another preferred embodiment, the radar measuring device (301, 401) as described herein, characterized in that the high-frequency unit (306, 405) has a measuring frequency of more than 50 GHz, preferably more than 80 GHz, further preferably 100 GHz or more.

In another preferred embodiment, the radar measuring device (301, 401) as described herein, characterized in that the radar measuring device (301, 401) has an input circuit (302) to ensure electromagnetic compatibility.

In another preferred embodiment, the radar measuring device (301, 401) as described herein, characterized in that the supply unit (403) is integrated into the communication unit (402).

In another preferred embodiment, the radar measuring device (301, 401) as described herein, characterized in that the radar measuring device (301, 401) has an intermediate energy accumulator (406).

In another preferred embodiment, the radar measuring device (301, 401) as described herein, characterized in that the evaluation and control unit (305, 404) has an energy management device.

In an alternate embodiment, a method for operating a radar measuring device (301, 401) with a supply unit (303, 403) for supplying downstream units with energy, a communication unit (304, 402) to receive data from a superordinate unit and for transmitting data of the radar measuring device (301, 401) to the superordinate unit, an evaluation and control unit (305, 404) to control a downstream high-frequency unit and to evaluate measurements determined by the high-frequency unit (306, 405), with the communication unit (304, 402) being embodied as a single-drop interface, characterized in that the high-frequency unit (306, 405) is operated in an energy saving mode and activated at the request of a superordinate unit and/or cyclically for carrying out a measurement, and returned to the energy-saving mode after completing the measurement.

In another preferred embodiment, the method as described herein, characterized in that the radar measuring device (401) has an intermediate energy accumulator (406), and the high-frequency unit (405) is supplied with energy at least partially from the intermediate energy accumulator (406).

In another preferred embodiment, the method as described herein, characterized in that the evaluation and control unit (404) has an energy management device that activates and disables the high-frequency unit (405) over the energy management device.

In another preferred embodiment, use of a radar measuring device (301, 401) as described herein in an IO link network.

In another preferred embodiment, such use a radar measuring device (301, 401) as described herein in factory automation or logistics automation.

DETAILED DESCRIPTION OF THE INVENTION

Figure 1:
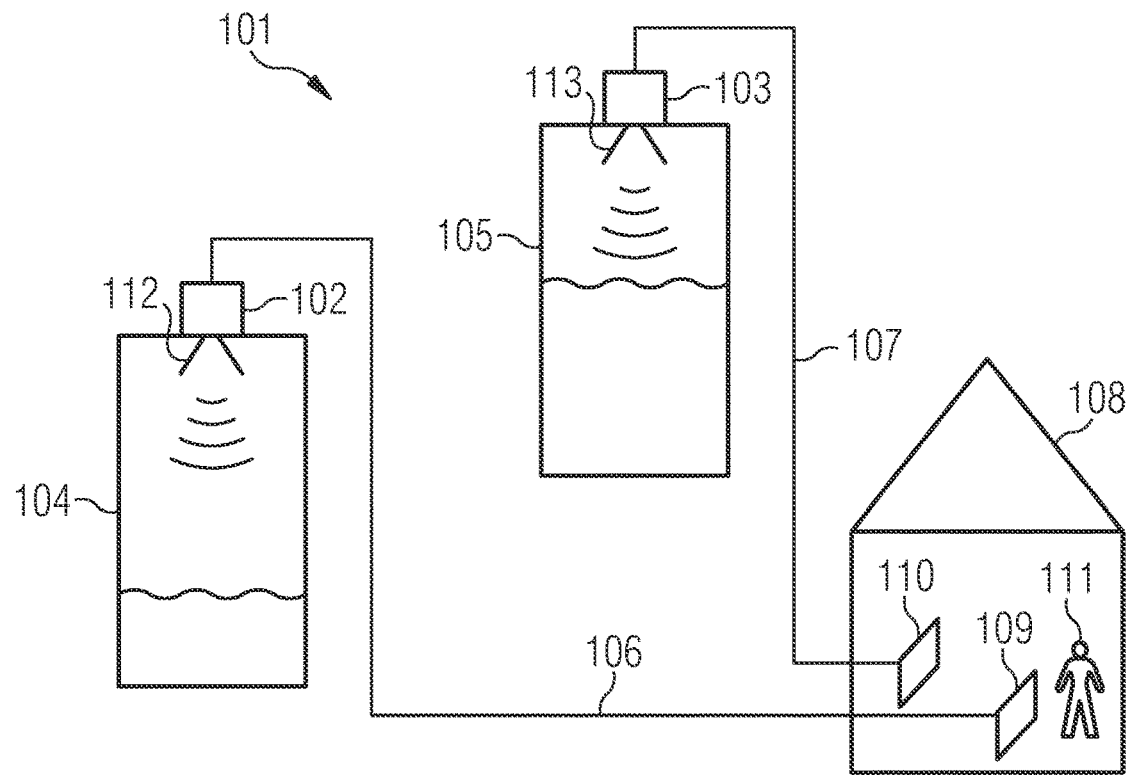
FIG. 1 is a line drawing evidencing an example of a system automation system (prior art).
Figure 2:
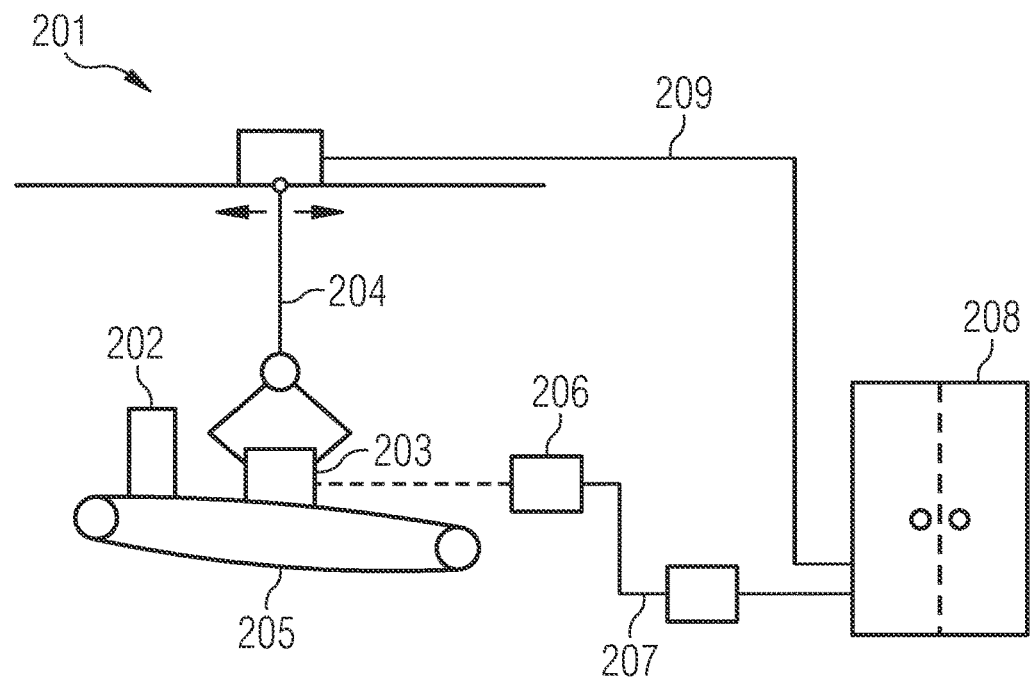
FIG. 2 is a line drawing evidencing an example of a system of logistics automation (prior art).

A radar measuring device according to the invention for factory automation and/or logistics automation with a supply unit for supplying downstream units with energy, a communication unit to receive data from a superordinate unit, and for transmitting data from the measuring device to the superordinate unit, an evaluation and control unit for controlling a downstream high-frequency unit, and for evaluating measurements determined by the high-frequency unit, is characterized by the fact that the communication unit is designed as a single-drop interface.

In a preferred embodiment, the single-drop interface can be configured as an IO link interface.

The name IO link refers to a communication system for connecting intelligent sensors and actuators to an automation system in standard IEC 61131-9 (as of September 2013) known under the designation single-drop digital communication interface for small sensors and actuators (SDCI). The standardization includes both the electrical connection data and a digital communication protocol, via which the sensors and actuators exchange data with the automation system. The communication system known under the name IO link is a serial, bidirectional point-to-point connection for signal transmission and power supply.

An IO link system consists of an IO link master and one or more IO link devices, i.e. sensors or actuators. The IO link master provides the interface to a superimposed control unit (PLC) and controls the communication with the connected IO link devices.

According to the present application, a connection of the radar measuring device to the IO-Link master is preferred comprising a three-lead standard cable.

The high frequency unit according to the present application preferably comprises a measuring frequency of more than 50 GHz, preferably 80 GHz or more. Due to frequencies in this range, a very good beam focus can be achieved, so that precise measurements can be made possible. Frequencies of 100 GHz or more are preferred for factory and logistics automation. In concrete embodiments, frequencies of 120 GHz or 240 GHz can be used. Frequencies above 100 GHz also allow a very small and compact design of the entire radar measuring device.

In order to avoid an unwanted fault of the present radar measuring device by electrical or electromagnetic effects of other devices or a fault of the other devices caused by the present radar measuring device, the radar measuring device of the present application preferably comprises an input circuit to ensure electromagnetic compatibility.

To achieve an even more compact design and manufacturing costs as low as possible, the supply unit is preferably integrated in the communication unit. By using standard IO link components with integrated supply unit, it is ensured that favorable components can be used. By using these standard components, which are largely optimized and produced in large quantities, a compact design can also be ensured in addition to a favorable price.

Since particularly the high-frequency unit has an increased energy need that cannot be covered in continuous operation by the supply unit integrated in the standard components, the radar measuring arrangement may comprise an intermediate energy accumulator. Using such an intermediate energy accumulator, e.g. a suitable sized capacitor or a battery, energy can be temporarily stored for a subsequent measurement and made available at the time of measurement, for example during the evaluation of a measurement.

The supply systems integrated into standard components allow maximum output of approx. 100 mW, which is not sufficient for the operation of a high-frequency unit, for example for distance measurement. Such high-frequency units have power consumption of approx. 500 mW, so that additional measures are required to ensure operation.

In addition, and/or alternatively, the analysis and control unit of the radar meter can comprise an energy management device. By means of an appropriate energy management, the high frequency unit can generally be operated e.g., in an energy saving mode with reduced energy requirement, and only when a measurement value is required, e.g., transferred for example by the IO link master from the energy saving mode to a measurement mode. This is possible, if for example the integrated power supply is able to supply the increased energy draw for a short term to take a measurement, but not in continuous operation.

In combination with an intermediate energy accumulator, it can be achieved that the energy required for a measurement in measurement mode can be achieved faster.

An energy saving mode shall be understood in the present application as an operating state of the high frequency unit with a reduced energy requirement compared to normal operation. An energy saving mode includes in particular a standby mode and also a complete deactivation. Other states with reduced energy consumption should also be included, whereby a reduction in energy consumption must always be present in reference to normal operation. This means in particular that a normal operating state during which no measurement takes place, is not to be understood as energy saving mode.

Alternatively, instead of taking measurements only upon request, the high-frequency unit also can be switched over cyclically—e.g. in regular intervals—from energy saving mode to measurement mode in order to carry out a measurement. Of course, a cyclical operation can be combined with an operation upon request as described above.

A method according to the invention for operating a radar meter with a power supply for supplying downstream units with energy, a communication unit to receive data from a superordinate unit and to transmit data from the measuring device to the superordinate unit, an analysis and control unit for controlling a downstream high-frequency unit and for evaluating measurements determined by the high-frequency unit, with the communication unit being formed as a single-drop interface, is characterized in that the high-frequency unit is operated in an energy-saving mode and activated upon request from a superordinate unit and/or cyclically to perform a measurement, and returns to the energy-saving mode upon concluding the measurement.

If the radar meter has an intermediate energy accumulator, the high-frequency unit can at least partially be supplied with energy from the intermediate energy accumulator, at least in measurement mode. In this way, an additional energy requirement of the high frequency unit can be satisfied to carry out a measurement using the intermediate energy accumulator. When the high-frequency unit is operating in energy saving mode, the intermediate energy accumulator can be recharged.

If the evaluation and control unit comprises an energy management device, energy management, which means, for example, enabling and disabling the high frequency unit, or a transfer of the high frequency unit from energy saving mode into a measurement mode and vice versa, is carried out by the energy management device. In addition to the high-frequency unit, additional components of the radar meter can also be recorded by energy management.

According to the invention, the radar device of the present application is used in an IO link network. It can be used for example in the area of factory automation or logistics automation.

DETAILED DESCRIPTION OF THE FIGURES

Figure 3:
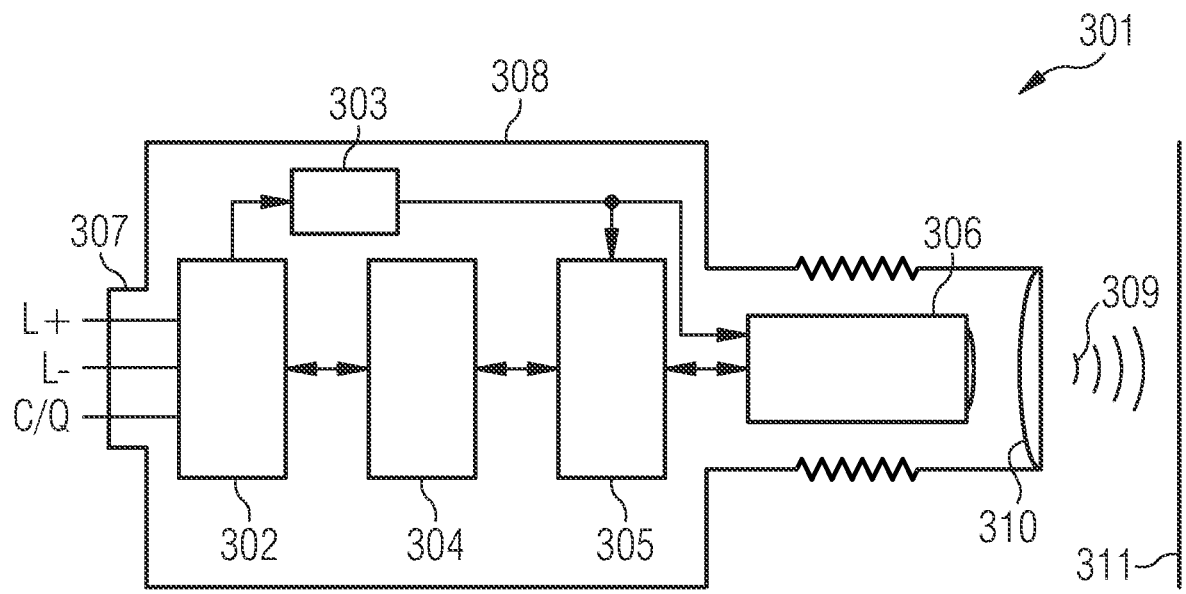
FIG. 3 is a line drawing evidencing a first exemplary embodiment of a radar measuring device according to the present application.

FIG. 3 shows a first exemplary embodiment of a radar measuring device 301 according to the present application. These show the fundamental structure as well as the operating principle of a radar measuring device 301, which in the present exemplary embodiment is designed as a 3-lead radar measuring device suitable for use in factory and or logistics automation.

Essential components of the radar measuring device 301 are an EMC circuit 302 at the input side, a communication unit 304, which is designed as a digital IO link interface, an evaluation and control unit 305, as well as a high-frequency unit 306. Both the evaluation and control unit 305 as well as the high-frequency unit 306 are supplied with energy via a supply unit 303, which is connected downstream to the EMC input circuit 302. The communication unit 304 is designed in the present exemplary embodiment, for the purpose of cost optimization, as a commercially available IO link communication unit. In the present exemplary embodiment, an embodiment with a 3-lead interface is provided, whereby the connections L+ and L− are configured for voltage supply with a nominal voltage of 24V and the C/Q connection is configured as data input/output terminal.

For applications in factory and logistics automation, here a M12 plug-in connection 307 is typical for the connection line and a very compact sensor housing 308. This is advantageously made from stainless steel. The high-frequency unit 306 comprises at least one integrated radar chip, which can generate and emit high-frequency radar signals 309 with frequencies in the range of 80 GHz and more. Radar signals 309 penetrate the housing of the radar sensor 301 on a microwave window 310 at a pre-defined location, wherein the housing of the sensor 301 is permeable at least in the area of penetration for the generated radar signals. In particular frequencies above 100 GHz are interesting for radar systems in factory and logistics automation. The radiated electro-magnetic waves are reflected on an object 311 shown in FIG. 3, received and evaluated by the high-frequency unit 306. For example, distance and/or speed information can be determined as process information, which is supplied by the control and analysis unit 305 to the IO link communication unit 304.

Using the IO link communication unit 304, the process information can be forwarded to an IO link master or to a superordinate automation system. Both the evaluation and control unit 305 as well as the high-frequency unit 306 are fed and supplied with energy by an external supply unit 303. The separately embodied supply unit 303 is necessary here since an internal supply unit of the communication unit 304 fails to provide sufficient power for operating the evaluation and control unit 305 and the high-frequency unit 306.

Figure 4:
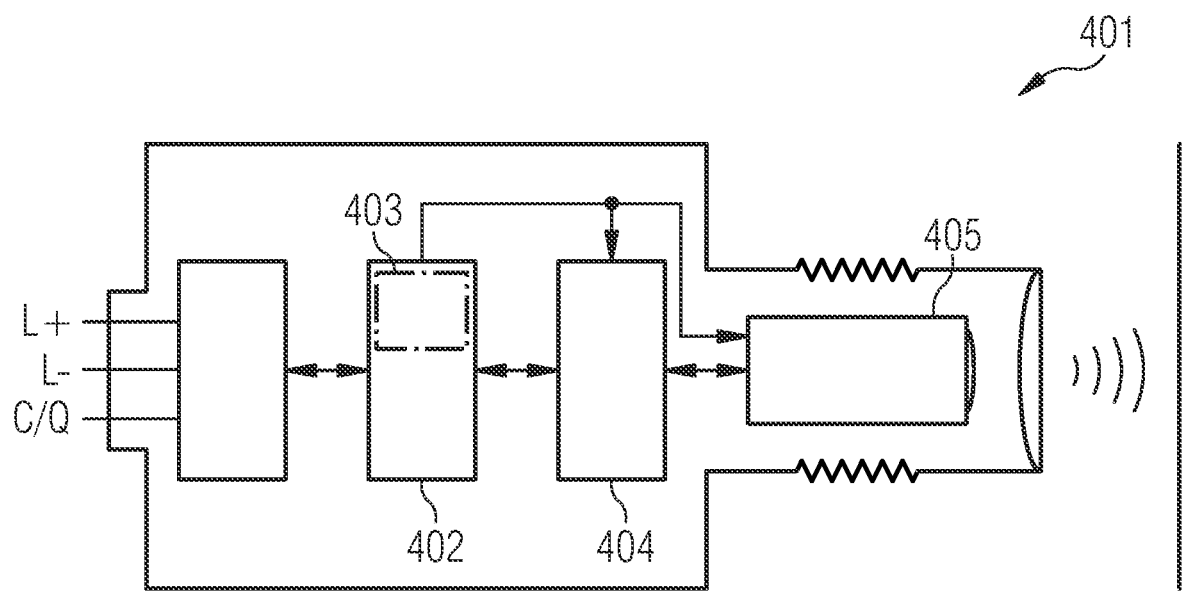
FIG. 4 is a line drawing evidencing a second exemplary embodiment of a radar measuring device according to the present application.

FIG. 4 shows a second exemplary embodiment of a radar measuring device 401.

A central component of this sensor is an IO link communication unit 402 with integrated power supply 403. This integration results in the significant advantage that the evaluation and control unit 404 as well as the high-frequency unit 405 can be fed directly from the communication unit 402. The separate supply unit 303 can therefore be omitted, thus providing a compact and affordable radar measuring device 401 with IO-link capability. The commercially available communication unit 402 with integrated power supply 403 however fails to provide enough energy for supplying all circuit components, i.e., in particular the evaluation and control unit 404 and the high frequency unit 405. In particular, the high-frequency unit 405 requires a lot of energy.

In order to still realize the benefits of using the integrated supply unit 403, an intelligent power management is implemented in the exemplary embodiment according to FIG. 4. In order to make due with the energy provided by the internal supply unit 403, the high-frequency unit 405 is operated in energy saving mode. The high-frequency unit 405 is activated for the duration of a measurement and directly after the measurement is returned back to energy saving mode only when a current measurement value is requested and required by the IO link master. Only with suitable power management it is possible to use the internal supply unit 403 of the communication unit 402, thus reducing space as well as costs.

If the energy provided by the internal supply unit 403 is not sufficient for a measurement of the high-frequency unit 405 in regular operation, an energy intermediate storage unit can additionally be provided to store energy when the high-frequency unit 405 is in energy saving mode, and to supply this energy at the time of a measurement.

Figure 5:
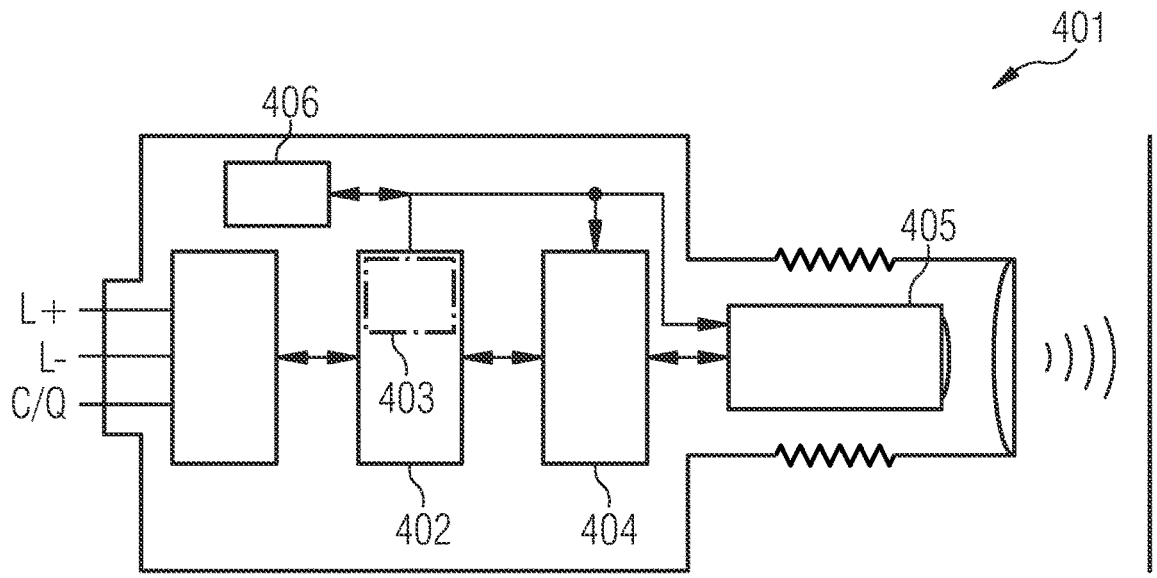
FIG. 5 is a line drawing evidencing a variant of the radar measuring device according to FIG. 4 with an intermediate energy accumulator.

FIG. 5 shows the radar measuring device according to FIG. 4, wherein the radar measuring device additionally comprises an intermediate energy accumulator 406, which is connected to the integrated supply unit 403 of the IO link communication unit 402, and additionally to the evaluation and control unit 404, as well as the high frequency unit 405. The evaluation and control unit 404 is also connected to the high-frequency unit 405. The intermediate energy storage is in the present exemplary embodiment designed as capacity that temporarily stores additional energy when the 405 high-frequency unit is operating in energy saving mode, and supplies this energy to the high-frequency unit 405 for performing a measurement.

Figure 6:
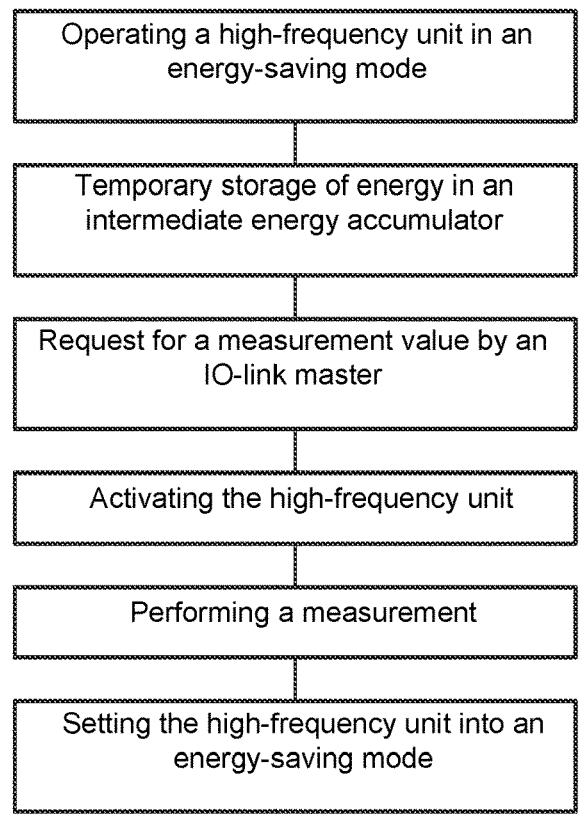
FIG. 6 is a flow chart evidencing a method for operating the radar measuring device according to FIG. 5.

FIG. 6 shows a flow diagram of a method for operating the radar measuring device 401 according to FIG. 5. The high-frequency unit 405 is initially operated in an energy saving mode, which means according to the present exemplary embodiment that the high-frequency unit is deactivated by the evaluation and control unit 404. While the high-frequency unit 405 is deactivated and therefore is not consuming any energy, the intermediate energy accumulator 406 is charged by the integrated supply unit 403 of the IO link communication module 402.

When a measurement signal is requested by the IO link master, the high-frequency unit 405 is activated, i.e. switched over from energy saving mode into an operating mode. A measurement is carried out; in addition to the energy from the supply unit 403, the high-frequency unit 405 is for this purpose supplied with energy from the intermediate energy accumulator 406. In this way, the increased energy requirement of the high-frequency unit 405, which cannot be covered by the supply unit 403 alone, can still be provided.

After completing the measurement, the high-frequency unit 405 is returned to energy saving mode and the intermediate energy accumulator 406 is recharged until another measured value is required.

LIST OF REFERENCE NUMBERS

101 Arrangement
102 Process measuring device
103 Process measuring device
104 Container
105 Container
106 special communication connection
107 special communication connection
108 Control room
109 Monitoring system
110 Process control system
111 User(s)
112 Radar antenna made from stainless steel
201 Package sorting system
202 Packages
203 Packages
204 Sorting crane
205 Conveyor belt
206 Laser sensors and/or camera sensors
207 Data line
208 Control
209 Control line
301 Radar meter
302 Input circuit EMC circuit
303 Supply unit
304 Communication unit
305 Evaluation and control unit
306 High-frequency unit
307 M12 plug-in connection
308 Sensor housing
309 Radar signal
310 Microwave window
311 Object
401 Radar measuring device
402 IO link communication unit
403 Integrated power supply
404 Evaluation and control unit
405 High-frequency unit
406 Intermediate energy accumulator The references recited herein are incorporated herein in their entirety, particularly as they relate to teaching the level of ordinary skill in this art and for any disclosure necessary for the commoner understanding of the subject matter of the claimed invention. It will be clear to a person of ordinary skill in the art that the above embodiments may be altered or that insubstantial changes may be made without departing from the scope of the invention. Accordingly, the scope of the invention is determined by the scope of the following claims and their equitable equivalents.

We claim:

1. A radar measuring device for factory automation and/or logistics automation with:
a supply unit for supplying downstream units with energy,
a communication unit for receiving data from a superordinate unit and for a transfer of data from the radar measuring device to the superordinate unit, and
an evaluation and control unit for controlling a downstream high-frequency unit and for evaluating measurement data determined by the high-frequency unit,
wherein the communication unit is configured as a single-drop interface, wherein the supply unit is integrated into the communication unit, wherein the radar measuring device has an intermediate energy accumulator, which is connected to the integrated supply unit of the communication unit, and additionally to the evaluation and control unit, as well as the high frequency unit, wherein the intermediate energy accumulator is charged by the integrated supply unit of the communication unit, when the high-frequency unit is operated in energy saving mode.

2. The radar measuring device of claim 1, wherein the single-drop interface is configured as an IO link interface.

3. The radar measuring device of claim 1, wherein the high-frequency unit has a measuring frequency of 100 GHz-3,000 GHz.

4. The radar measuring device of claim 1, wherein the radar measuring device has an input circuit to ensure electromagnetic compatibility.

5. The radar measuring device of claim 1, wherein the evaluation and control unit has an energy management device.

6. The radar measuring device of claim 1, wherein the supply unit is integrated into the communication unit.

7. The radar measuring device of claim 1, wherein the radar measuring device has an intermediate energy accumulator.

8. A method for operating a radar measuring device with a supply unit for supplying downstream units with energy, a communication unit to receive data from a superordinate unit and for transmitting data of the radar measuring device to the superordinate unit, an evaluation and control unit to control a downstream high-frequency unit and to evaluate measurements determined by the high-frequency unit, with the communication unit being embodied as a single-drop interface, wherein the supply unit is integrated into the communication unit, wherein the radar measuring device has an intermediate energy accumulator, which is connected to the integrated supply unit of the communication unit, wherein the high-frequency unit is operated in an energy saving mode and activated at the request of a superordinate unit and/or cyclically for carrying out a measurement, and returned to the energy-saving mode after completing the measurement, and wherein the intermediate energy accumulator is charged by the integrated supply unit of the communication unit when the high-frequency unit is operated in energy saving mode.

9. The method of claim 8, wherein the radar measuring device has an intermediate energy accumulator, and the high-frequency unit is supplied with energy at least partially from the intermediate energy accumulator.

10. The method of claim 8, wherein the evaluation and control unit has an energy management device that activates and disables the high-frequency unit over the energy management device.

11. The method of using the radar measuring device in claim 8 in an IO link network.

12. The method of use of claim 11, wherein the method is used in factory automation or logistics automation.

\* \* \* \* \*